United States Patent
Tourino et al.

(10) Patent No.: US 6,809,412 B1
(45) Date of Patent: Oct. 26, 2004

(54) PACKAGING OF MEMS DEVICES USING A THERMOPLASTIC

(75) Inventors: Cory G. Tourino, Georgetown, TX (US); Janet L. Rice, Austin, TX (US); Gregory Flynn, Austin, TX (US)

(73) Assignee: Teravictu Technologies, Austin, TX (US)

( * ) Notice: Subject to any disclaimer, the term of this patent is extended or adjusted under 35 U.S.C. 154(b) by 0 days.

(21) Appl. No.: 10/188,899

(22) Filed: Jul. 3, 2002

Related U.S. Application Data

(63) Continuation-in-part of application No. 10/068,259, filed on Feb. 6, 2002, now Pat. No. 6,624,003.

(51) Int. Cl.$^7$ ............................................. H01L 23/02
(52) U.S. Cl. ...................................... 257/678; 257/777
(58) Field of Search ................................ 257/678, 777, 257/787, 788, 790, 796, 720, 778, 794, 666

(56) References Cited

U.S. PATENT DOCUMENTS

| | | | |
|---|---|---|---|
| 5,061,549 A | 10/1991 | Shores | |
| 5,234,152 A | 8/1993 | Glaeser | |
| 5,401,536 A | 3/1995 | Shores | |
| 5,604,160 A | 2/1997 | Warfield | |
| 5,694,740 A | 12/1997 | Martin et al. | |
| 5,736,607 A | 4/1998 | Martin et al. | |
| 5,798,557 A | 8/1998 | Salatino et al. | |
| 5,891,751 A | 4/1999 | Kurtz et al. | |
| 6,040,235 A | 3/2000 | Badehi | |
| 6,072,236 A | 6/2000 | Akram et al. | |
| 6,124,634 A | 9/2000 | Akram et al. | |
| 6,136,128 A | 10/2000 | Chung | |
| 6,210,514 B1 * | 4/2001 | Cheung et al. | 156/241 |
| 6,214,644 B1 | 4/2001 | Glenn | |
| 6,225,692 B1 | 5/2001 | Hinds | |
| 6,367,251 B1 * | 4/2002 | Wood | 60/528 |
| 6,392,144 B1 * | 5/2002 | Filler | 174/52.4 |
| 6,557,978 B2 * | 5/2003 | Silverbrook | 347/54 |

OTHER PUBLICATIONS

"VIA/PLANE®: An Enabling Interconnect Substrate," © 1998 Micro Substrates Corp., pp. 1–3.
"Ceramic Hybrid Electromechanical Systems," NASA's Jet Propulsion Laboratory, 2 pgs.
Harper, "Thermoplastic Die Attach for Hermetic Packaging," The International Journal of Microelectronics and Electronic Packaging, vol. 17, No. 4, Fourth Quarter 1994, 5 pages.
Gilleo et al., "Thermoplastic Die Attach Adhesive for Today's Packaging Challenges," pp. 1–7.
Gilleo et al., "Thermoplastic Adhesives—The Attachment Solution for Multichip Modules," 11 pages.

* cited by examiner

*Primary Examiner*—David Nhu
(74) *Attorney, Agent, or Firm*—Kevin L. Daffer; Conley Rose P.C.

(57) ABSTRACT

A microelectromechanical circuit includes a cover attached to a package substrate by a thermoplastic. A MEMS device is disposed between the cover and the packaging substrate. The thermoplastic is substantially free of solvents. In addition, surfaces of the device are substantially free of solvents. The cover, the packaging substrate, and the thermoplastic form a protective enclosure around the device. The MEMS device may be formed on a substrate. The substrate may be attached to the packaging substrate by a thermoplastic. The thermoplastic may also be substantially solvent-free. A method for forming the circuit includes heating a thermoplastic to a temperature sufficient to remove all solvent from the thermoplastic. The temperature may be above a boiling point of the solvent. The method also includes arranging the thermoplastic between the cover and the packaging substrate and applying pressure and heat to the thermoplastic to form a protective enclosure around the device.

14 Claims, 4 Drawing Sheets

PACKAGING OF MEMS DEVICES USING A THERMOPLASTIC

RELATED APPLICATIONS

This patent application is a continuation-in-part of U.S. patent application Ser. No. 10/068,259 entitled "Integrated MEMS Device and Package," filed Feb. 6, 2002 now U.S. Pat. No. 6,624,003.

BACKGROUND OF THE INVENTION

1. Field of the Invention

This invention pertains to microelectromechanical devices and circuits, and more particularly, to formation of such devices within and upon an integrated package. The invention also pertains to packaging of microelectromechanical devices and circuits using a thermoplastic.

2. Description of the Related Art

The following descriptions and examples are not admitted to be prior art by virtue of their inclusion within this section.

Microelectromechanical devices, or devices made using microelectromechanical systems (MEMS) technology, are of interest in part because of their potential for providing miniaturized sensors and actuators and performing functions not done or poorly done by semiconductor integrated circuit (IC) technology. As compared to transistor switches formed with conventional IC technology, for example, MEMS switches may exhibit lower losses and a higher ratio of off-impedance to on-impedance. Although the fabrication steps used to form MEMS devices are similar to those for forming integrated circuits, packaging of MEMS devices presents some additional complexity. Because MEMS devices tend to have moving parts, they cannot be encapsulated in the manner used for protection of purely electronic circuits. Instead, a hermetically sealed enclosure, or "cavity", around the MEMS device typically needs to be formed. The final step in fabrication of the MEMS device itself is typically a "release" of the device, in which a sacrificial layer is removed so that the device may move freely. The release process may be quite critical, involving, for example, careful anneals, etching and drying processes. After release of the MEMS device, any processing steps which may contaminate the device must be avoided until the protective enclosure around the device is formed.

As is done in IC manufacturing, many MEMS devices (or circuits) are typically formed on a single substrate, which is subsequently diced, or singulated, to separate the individual devices. The dicing is typically done using a saw, and is a particularly "dirty" and mechanically stressful process. Therefore it is preferable that MEMS have enclosures formed over them if they are released before dicing (also referred to as being released at "wafer level"). Alternatively, the devices may be singulated first and then released before additional packaging is done. In either case, the individual MEMS die are typically put into packages fairly similar to IC packages. The packaging could involve, for example, attaching the back side of the MEMS device substrate to the top side of a packaging substrate, then wire-bonding contact pads on the top side of the MEMS device substrate to contact pads on the packaging substrate, and affixing a cap to form the sealed cavity over the MEMS device (unless the device was already covered prior to singulation). This type of packaging scheme has disadvantages, however. For example, the individual handling of each die needed to place it into a package is expensive and potentially unreliable. The package size also has to be relatively large in order to accommodate the MEMS chip substrate and the wire bonds. Furthermore, the use of wire bonding can limit the performance of high-frequency devices by introducing parasitic impedances.

One alternative approach, also used in IC packaging, is to eliminate wire bonds through flip-chip bonding with solder bumps or balls. If the solder bumps are large enough, a MEMS chip can be flip-chip bonded to a packaging substrate with enough clearance for the (now upside-down) MEMS device to operate. An enclosure can be formed around the MEMS device using the packaging substrate, MEMS substrate, and an additional underfill material applied laterally around the device, as described in U.S. Pat. No. 6,214,644. Although this flip-chip approach may improve the reliability and performance of the package connections by removing the wire bonds, it is still necessary to handle individual MEMS die one at a time during packaging, and to perform multiple packaging steps (e.g. forming solder bumps, flip-chip bonding, underfill application and cure).

It would therefore be desirable to develop a MEMS packaging method and structure which reduces the need for individual device handling, improves package size and cost, and improves high-frequency performance.

SUMMARY OF THE INVENTION

The problems outlined above may be in large part addressed by formation of a is MEMS device upon a packaging substrate, rather than upon a separate device substrate.

A packaging substrate as used herein is a substrate similar to those used in packaging of integrated circuits. A packaging substrate is formed from an insulating material and includes conductive features on its lower surface. The conductive features, which may include conductive pads, pins, bumps or balls, are adapted for use in electrical coupling of the substrate to a circuit board or other circuit carrier. "Circuit board" as used herein may refer to a circuit board, carrier, or other surface to which a miniature circuit may be mounted. The packaging substrate may also include conductive interconnects extending within and through the substrate, where the interconnects are adapted to connect the conductive features to the upper surface of the substrate. The "upper surface" of the substrate as used herein is the surface upon which an IC would be mounted if the substrate were used in an IC-mounting context, while the "lower surface" is the surface that would face the circuit board in such a context. When a MEMS device is formed upon a packaging substrate, the underside of at least one element of the device is in contact with the upper surface of the substrate. This is in contrast to formation of the MEMS device upon a separate MEMS substrate, which might then be mounted upon the packaging substrate (either die-up mounting which would typically include wire bonds, or flip-chip, die-down mounting). In an embodiment, the underside of the MEMS device element may be formed upon an exposed end of a conductive interconnect within the substrate, allowing electrical coupling of the device element to the lower surface of the substrate or to another device or circuit formed on the substrate. Alternatively, the device element may be connected to an interconnect within the substrate through an interconnect formed on the surface of the substrate.

An embodiment of a microelectromechanical circuit as contemplated herein may further include a cover spaced above the device and the substrate. The cover may be spaced sufficiently above the device to permit proper electromechanical operation of the device. The circuit may further include a sealing structure interposed between the substrate and cover, where the sealing structure laterally surrounds the device. The sealing structure may include, for example, an adhesive or a metal layer. In an embodiment, the substrate, cover and sealing structure combine to form a protective enclosure around the device. In an additional embodiment of the microelectronic circuit, an IC may be mounted on the packaging substrate in a position laterally spaced from that of the MEMS device. The IC may be electrically coupled to the MEMS device by wire bonds or through interconnects within the substrate, and may be included within a protective enclosure formed around the device. In some embodiments, the IC may alternatively be external to the protective enclosure.

Some embodiments of the circuit described herein are believed to provide cost, manufacturability, and/or performance advantages. For example, multiple MEMS devices may be formed simultaneously upon a packaging substrate. In a preferred embodiment, the devices may be released and then covered before dicing. At the time of dicing, the MEMS devices are already packaged and protected. The devices may therefore be ready for assembly to a circuit board or carrier, with no further packaging required. Costly and unreliable handling of individual devices during packaging may therefore be avoided. Fabrication of the packaged MEMS device is believed to be relatively simple and inexpensive in some embodiments, since after formation and release of the device, the only remaining steps may be affixing a cover and dicing. Affixing of the cover may be done individually on each of the multiple devices, or at the "wafer level" on the devices as a group. High-frequency performance of the MEMS device may also be improved in some embodiments, since wire bonds and bulky packages are replaced with the low-loss, low-inductance conductive interconnects within the package substrate. The package size may also be reduced, since clearance is not needed for mounting of an additional MEMS substrate or for wire bonds.

In addition to the microelectromechanical circuit described above, an array of microelectromechanical circuits is contemplated herein. In an embodiment, the array includes first and second microelectromechanical devices formed laterally spaced upon the upper surface of a packaging substrate, first and second covers spaced above the substrate and the first and second devices, respectively, and a sealing structure interposed between the substrate and the first and second covers, where the sealing structure laterally surrounds each of the first and second devices. In an embodiment, the first and second covers may be portions of a single cover for the array. The substrate, sealing structure, and first and second covers may combine to form a protective enclosure for each of the first and second devices. In such an embodiment, the protective enclosures are adapted to remain intact after separation of the substrate portions underlying the first and second devices (singulation of the devices). In a further embodiment, the first and second devices are adapted to be operable through application of electrical signals to appropriate conductive features on the lower surface of the substrate, either before or after singulation.

A method of forming a microelectromechanical device includes forming the device upon a packaging substrate having one or more conductive features upon its lower surface, where an underside of at least one element of the device is in contact with the upper surface of the substrate. Forming the device may include patterning a conductive layer deposited upon the packaging substrate, and may further include releasing the device to permit electromechanical operation. The method may further include affixing a cover to the substrate, where the cover is spaced above the device. Affixing the cover may include interposing a sealing structure between the substrate and the cover, and the substrate, cover and sealing structure may combine to form a protective enclosure around the device. In such an embodiment, the method may also include simultaneously forming an additional enclosed device laterally spaced upon the substrate, where the additional device is covered by an additional cover and laterally surrounded by an additional sealing structure. The additional cover and the cover may in an embodiment be portions of a single larger cap, and the additional sealing structure and the sealing structure may be portions of a single larger sealing layout. The method may further include separating the device from the additional device, where the device and the additional device each remains protectively enclosed after the separation.

An additional embodiment relates to a microelectromechanical circuit that includes a cover attached to a packaging substrate by a thermoplastic and a MEMS device disposed between the cover and the packaging substrate. The thermoplastic is substantially free of solvents. In one embodiment, the device may be formed on a substrate. The substrate may be attached to the packaging substrate with an additional thermoplastic. The two thermoplastics may be formed of the same or different materials. The additional thermoplastic may also be substantially free of solvents. In an alternative embodiment, the device may be formed on the packaging substrate. In addition, surfaces of the device are substantially free of solvents.

A thickness of the thermoplastic may be greater than or less than z-axis height requirements of the device. For example, if the cover does not have recesses, the thermoplastic may be thicker than z-axis height requirements of the device to provide a stand off for the cover. In this manner, the thickness of the thermoplastic may be selected to permit proper electromechanical operation of the MEMS device. The thermoplastic may laterally surround the MEMS device. The cover, the packaging substrate, and the thermoplastic may form a protective enclosure around the device.

In an additional embodiment, the circuit may also include an additional MEMS device disposed between the cover and the packaging substrate. The cover, the packaging substrate, and the thermoplastic may form one protective enclosure around the two devices. In an alternative embodiment, an IC may be disposed between the cover and the packaging substrate. The cover, the packaging substrate, and the thermoplastic may form one protective enclosure around the MEMS device and the IC.

A further embodiment relates to an array of microelectromechanical circuits that includes a packaging substrate. First and second MEMS devices may be disposed upon an upper surface of the packaging substrate. First and second covers may be spaced above the packaging substrate and the first and second devices, respectively. A thermoplastic may be interposed between the packaging substrate and the first and second covers. The thermoplastic may laterally surround each of the devices. In an embodiment, the first and second covers may be portions of a single cover for the array. In this embodiment, a thickness of the thermoplastic may be greater than z-axis height requirements of the first and second devices. In another embodiment, the first and second covers may include first and second recessed portions aligned over the first and second devices, respectively. In this embodiment, a thickness of the thermoplastic may be less than z-axis height requirements of the first and second devices. The packaging substrate, thermoplastic, and first and second covers may combine to form a protective enclosure for each of the first and second devices. The protective enclosures may be adapted to remain intact after separation of the packaging substrate portion underlying the first device from that underlying the second device. The array of circuits may be further configured as described herein.

An additional embodiment relates to a microelectromechanical circuit that includes a MEMS device formed on a substrate. The substrate may be attached to a packaging substrate by a thermoplastic. The thermoplastic may be substantially free of solvents. In addition, surfaces of the device may be substantially free of solvents. The microelectromechanical circuit may be further configured as described herein.

Another embodiment relates to a method for forming a microelectromechanical circuit that includes heating a thermoplastic to a temperature sufficient to remove substantially all solvent from the thermoplastic. Such a temperature may be above a boiling point of a solvent in the thermoplastic. The thermoplastic may be in a sheet form, a preform formed from a sheet of the thermoplastic, or a thermoplastic in a paste form. In some embodiments, the thermoplastic may be applied to the cover or the packaging substrate prior to heating. Therefore, heating may include adhering the thermoplastic to the cover or the packaging substrate. The method may also include arranging the thermoplastic between the cover and the packaging substrate and laterally surrounding a MEMS device disposed on the packaging substrate. In addition, the method may include attaching the thermoplastic to the cover and the packaging substrate to form a protective enclosure around the device by applying pressure and heat to the thermoplastic substantially simultaneously. The thermoplastic may then be cooled, and the pressure may be maintained on the thermoplastic during cooling. Surfaces of the device may be substantially free of solvents, and the thermoplastic may have a thickness as described above.

In one embodiment, the method may include forming the MEMS device on a substrate and separating a portion of the substrate underlying the device from the substrate. In addition, the portion of the substrate may be attached to the packaging substrate prior to arranging the thermoplastic between the cover and the packaging substrate. In one embodiment, the substrate may be attached to an upper surface of the packaging substrate with an additional thermoplastic. The additional thermoplastic may be substantially free of solvents. In an alternative embodiments, a MEMS device may be formed on an upper surface of the packaging substrate. In an embodiment, the method may also include separating a portion of the packaging substrate underlying the device from the packaging substrate after forming the protective enclosure around the MEMS device.

In another embodiment, the thermoplastic may be further arranged to surround the MEMS device and an additional MEMS device. The additional device may also be disposed on the packaging substrate. In this manner, a protective enclosure may be formed around the two devices. In a different embodiment, the thermoplastic may arranged to surround the MEMS device and a semiconductor-based IC disposed on the packaging substrate. Therefore, the protective enclosure may be formed around the device and the IC.

A further embodiment relates to a method for forming an array of microelectromechanical circuits. The method may include heating a thermoplastic to a temperature sufficient to remove substantially all solvent from the thermoplastic. The method may also include arranging the thermoplastic between the first and second covers and a packaging substrate and laterally surrounding first and second MEMS device. The first and second MEMS devices may be disposed on the packaging substrate underlying the first and second covers, respectively. In addition, the method may include attaching the thermoplastic to the first and second covers and the packaging substrate to form a protective enclosure around each of the first and second devices by applying pressure and heat to the thermoplastic substantially simultaneously.

In one embodiment, the first and second covers may be portions of a single cover for the array, and a thickness of the thermoplastic may be greater than z-axis height requirements for the first and second devices. In an alternative embodiment, the first and second covers may include recessed portions aligned over the first and second devices, respectively. In this embodiment, a thickness of the thermoplastic may be less than z-axis height requirements of the first and second devices. The method may also include separating the packaging substrate into a first portion underlying the first device and a second portion underlying the second device after the thermoplastic is attached to the covers and the packaging substrate. The protective enclosure may be adapted to remain intact after separation. In another embodiment, the method may include forming the first and second device on a substrate and separating the substrate into a first portion underlying the first device and a second portion underlying the second device. The first and second portions of the substrate may be attached to an upper surface of the packaging substrate with an additional thermoplastic. The additional thermoplastic may be substantially free of solvents. In an alternative embodiment, the method may include forming the first and second devices on an upper surface of the packaging substrate. The method may include any additional steps as described herein.

Yet another embodiment relates to a method for forming a microelectromechanical circuit that includes heating a thermoplastic to a temperature sufficient to remove substantially all solvent from the thermoplastic and to adhere the thermoplastic to a packaging substrate. Such a temperature may be above a boiling point of a solvent in the thermoplastic. The thermoplastic may be in a sheet form, a preform formed from a sheet of the thermoplastic, or a paste form. The method may also include arranging a substrate on the thermoplastic. A MEMS device is formed on the substrate. In one embodiment, the method may include separating a portion of the substrate underlying the device from the substrate prior to arranging the substrate on the thermoplastic. In addition, the method may include attaching the substrate to the thermoplastic by applying pressure and heat to the thermoplastic substantially simultaneously. The thermoplastic may then be cooled while maintaining the pressure on the thermoplastic. The thermoplastic and surfaces of the device are substantially free of solvents.

BRIEF DESCRIPTION OF THE DRAWINGS

Other objects and advantages of the invention will become apparent upon reading the following detailed description and upon reference to the accompanying drawings in which.

Figure 1:
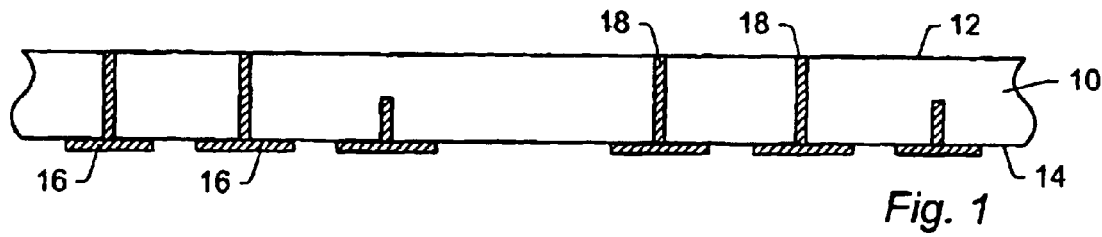
FIG. 1 is a partial cross-sectional view of an embodiment of a packaging substrate which may be used in formation of a microelectromechanical device as described herein.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

A partial cross-sectional view of an embodiment of a packaging substrate which may be used in forming a MEMS device as described herein is shown in FIG. 1. Substrate 10 includes an upper surface 12 and lower surface 14. As noted above, the "upper surface" is the surface upon which an integrated circuit might be mounted if the substrate were used for IC packaging, while the lower surface is the surface facing a circuit board if the packaging substrate is mounted to a circuit board. Conductive features 16 are formed on lower surface 14 of substrate 10. The conductive features may be conductive pads, as shown in FIG. 1. Alternatively, the features may be other types of features useful for connection of substrate 10 to a circuit board or carrier, such as pins, solder bumps, or solder balls. In general, conductive features 16 may be adapted for use in electrical coupling of substrate 10 to such a circuit board (not shown). Because FIG. 1 is a cross-sectional view, there may be many other conductive features 16 not shown in FIG. 1. Substrate 10 may also extend laterally to the left and right beyond the edges shown in FIG. 1, but is cut off in the drawing merely for simplifying the illustration. For example, substrate 10 may be a 4'×4" square in some embodiments. In other cases, substrate 10 may include other shapes and/or sizes, depending on the design specifications of the fabrication process.

Conductive interconnects 18 may extend within and through substrate 10. Depending on the particular device and/or circuit configuration, an interconnect 18 may have functions such as connecting a conductive feature 16 to upper surface 12 of the substrate, connecting different ones of features 16 to one another, or connecting together different points or features on upper surface 12. The configuration of interconnects 18 in FIG. 1 is merely exemplary, and actual configurations could be entirely different and considerably more complex. In the configuration of FIG. 1, interconnects for which both ends are not shown are interconnects which "turn a corner" and extend in a direction out of the plane of the cross-section shown.

FIG. 1, along with the other drawings described herein, is not necessarily drawn to scale. In an embodiment, substrate 10 has a thickness from approximately 0.25 mm to a few mm, and interconnects 18 have diameter from approximately 0.05 mm to approximately 1 mm. Other dimensions may also be suitable, however, depending on the particular requirements and formation process for the substrate. For example, if substrate 10 is made from ceramic, a suitable substrate thickness may be from about 0.25 mm to about 1 mm, and interconnect diameter from about 0.05 mm to about 0.2 mm. For a substrate made from a circuit board material, the preferred substrate thickness and interconnect diameter may be larger. In a currently preferred embodiment, substrate 10 is formed from aluminum oxide (alumina) and interconnects 18 are formed from copper or a tungsten-copper composite. Such a substrate is available from vendors such as Micro Substrates Corporation of Tempe, Ariz., or CirQon Technologies Corporation of Gurnee, Ill. Substrate 10 could also be formed from any other material capable of having interconnects formed within or upon it. Such materials may include, for example, other ceramics, glass, quartz, or semiconductors. Semiconductor substrates could include integrated circuits in addition to the interconnect 18. Other possibilities include printed circuit board type materials such as polyimides, epoxies or other organic materials. Similarly, interconnects 18 could be formed from other conductors such as metals and/or metal alloys, subject to appropriate considerations such as adhesion and thermal properties. Conductive features 16 may or may not be formed from the same material as interconnects 18. For example, conductive features 16 may advantageously include a solderable material such as nickel with a thin gold coating.

Figure 2:
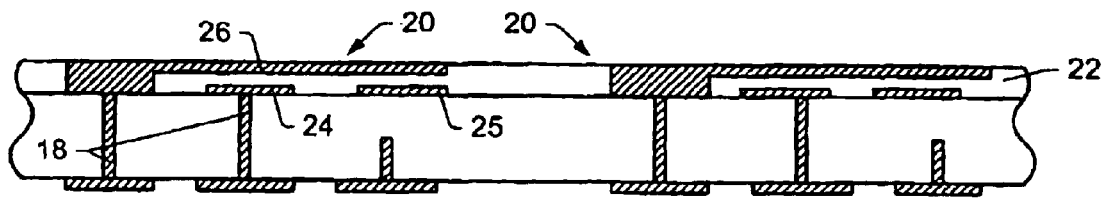
FIG. 2 shows the packaging substrate of FIG. 1 with exemplary MEMS devices formed upon it.

The formation of MEMS devices 20 and sacrificial layer 22 on upper surface of substrate 10 is illustrated in FIG. 2. Although FIG. 2 shows two MEMS devices upon substrate 10, multiple other devices may be formed upon substrate 10. In particular, multiple other devices may be formed upon portions of substrate 10 not shown in the partial cross-sectional view of FIG. 2. In some embodiments, multiple MEMS devices and/or semiconductor-based integrated circuits may be arranged upon substrate 10. In addition, the multiple devices may be arranged upon substrate 10 such that each device may be separately packaged and/or that sufficient space may be left between the devices for subsequent singulation of substrate 10, as discussed in the description of FIG. 6 below. In some cases, one or more of the devices may be arranged upon substrate 10 such that at least one element of the one or more devices is coupled to an interconnect 18. In this manner, the one or more devices may be electrically coupled to other devices arranged upon substrate 10 through interconnect 18. In particular, MEMS devices 20 shown in FIG. 2 may be electrically coupled to each other through interconnects 18 or interconnects running on the top surface of the substrate 10. In addition or alternatively, one or more of MEMS devices 20 may be electrically coupled to a semiconductor-based integrated circuit formed upon substrate 10 (not shown). In an embodiment, the one or more devices are electrically coupled to devices which are arranged within the same die portion of the substrate. In this manner, the devices may be adapted to be operable through application of electrical signals through conductive features within and on substrate 10 both before and after the singulation process described in reference to FIG. 6 below.

Although device 20 of FIG. 2 is shown as a cantilever switch for simplicity, any of various other MEMS devices could also be formed, including other switches, sensors, actuators, variable capacitors, and optical devices. In the embodiment of FIG. 2, device 20 is an electrostatically actuated switch, in which a voltage may be applied to control gate 24 to bring cantilever arm, or beam, 26 into or out of contact with contact pad 25. Other MEMS devices could be formed that use other forms of actuation, however, such as magnetic or thermal actuation. In an embodiment for which multiple devices are formed within a single die area, the devices may be of the same type or of different types. The dimensions of elements of MEMS device 20 may depend on the particular device type and purpose of the device. In some embodiments, for example, the vertical gap between control element 24 and the suspended element 26 may be on the order of one to ten microns. In addition or alternatively, the width of cantilever element 26 and lateral dimensions of elements 24 and 25 may be on the order of tens to hundreds of microns, while the length of the cantilever may be on the order of tens to hundreds of microns. Larger or smaller dimensions, however, may be used depending on the design specifications of the device and the particular materials and process used. A method of forming MEMS devices 20 and sacrificial layer 22 may include depositing and patterning a conductive layer to form elements 24 and 25, and subsequently depositing sacrificial layer 22 upon these elements and exposed portions of substrate 10. In some embodiments, the formation of MEMS devices 20 may further include patterning an opening within sacrificial layer 22 and subsequently depositing a conductive layer to form the support portion of suspended element 26. En other embodiments, the support portion of element 26 may be formed prior to the deposition of sacrificial layer 22 and the suspended element 26 may be deposited separately after completion of the sacrificial layer. The dimensions and fabrication methods described here may vary for other types of MEMS devices, as will be clear to one of ordinary skill in the art of MEMS fabrication having the benefit of this disclosure.

In general, sacrificial layer 22 and the conductive layers used to form elements 24 and 25 and suspended element 26 may be formed using various techniques, including chemical vapor deposition, physical vapor deposition techniques such as evaporation or sputtering, and electrochemical plating, or combinations of such methods. In addition, patterning of the conductive layers and sacrificial layer 22 may be done by lithography and etching techniques used in semiconductor fabrication processes. In some embodiments, the thickness of sacrificial layer 22 may be on order of a few microns, or more specifically between about 1 and about 10 microns. A suitable thickness for the conductive layers may be from about 0.1 micron to about 10 microns. In one embodiment, the thickness of the conductive layers may be between approximately 1 micron and approximately 5 microns. However, thinner or thicker layers may be used for sacrificial layer 22 and the conductive layers depending on the design specifications of the device and the particular materials and process used.

Element 24 and cantilever element 26 may include a variety of materials. For example, element 24 and cantilever element 26 may include conductive materials, such as doped polysilicon or metals such as, gold, copper, nickel, titanium, tungsten, or an alloy of such metals. In addition or alternatively, element 24 and/or cantilever element 26 may include dielectric materials, such as polyimide, silicon nitride, silicon oxide, or silicon oxynitride. Furthermore, element 24 and/or cantilever element 26 may include adhesion layers or layers for promoting good electrical contact with upper ends of interconnects 18. In some embodiments, element 24 and cantilever element 26 may include the same materials. Alternatively, element 24 and cantilever element 26 may include different materials. In addition, sacrificial layer 22 may include any material suitable for patterning and that has sufficiently different etch characteristics than the materials used for element 24 and cantilever element 26. In this manner, sacrificial layer 22 may be selectively removed during the releasing process as discussed in the description of FIG. 3 below. In some embodiments, sacrificial layer 22 may include a dielectric material, such as silicon oxide or nitride, silicon oxynitride or polyimide, or a metal such as, gold, copper, nickel, titanium, tungsten, or an alloy of such metals.

Figure 3:
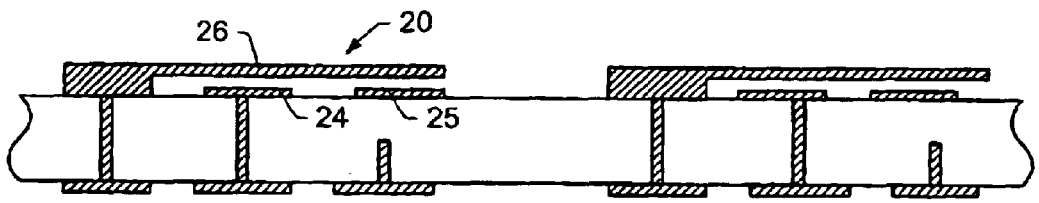
FIG. 3 shows the MEMS devices of FIG. 2 after they are "released;"

FIG. 3 illustrates the "release" of MEMS devices 20. In other words, FIG. 3 illustrates the topography subsequent to the removal of all or at least a portion of sacrificial layer 22. Such a removal of sacrificial layer 22 is preferably done at least between elements 24 and 25 and cantilever element 26 in each of devices 20. Consequently, the release process may allow cantilever elements 26 to be freestanding. As such, the release process may permit electromechanical operation of MEMS devices 20. In some cases, the release process may further include a thermal treatment process before or after removal of layer 22 to optimize the performance of the devices.

Although the method and structure described herein are believed to allow release of multiple devices at once, in some cases it may be preferable to release only subsets of the devices at a time. Therefore, in some embodiments, substrate 10 may be divided into smaller portions using a dicing tool such as a saw or laser prior to releasing the devices. For example, in an embodiment in which substrate 10 includes a 4"×4" square, substrate 10 may be cut into 2"×2" square portions before the release process. Substrate 10, however, may be cut into different size and/or shaped portions depending on the particular materials and process used. If cut at all before releasing of the devices, substrate 10 is preferably cut into portions that still include multiple circuits formed thereon. In other words, the substrate is preferably maintained in portions that include more than one die. In this manner, covers may be formed over a plurality of circuits at one time, thereby lowering fabrication costs and time. As such, the aforementioned cutting process may be distinct from the singulation process described below, in which sealed substrate 10 is divided into single, packaged circuits.

In some embodiments, the devices formed upon substrate 10 may be tested subsequent to the release of MEMS devices 20. In particular, the devices formed upon substrate 10 may be tested subsequent to the release of MEMS devices 20, but prior to covering the devices as described below. Such a test process may be conducted through test pads formed upon the top of substrate 10, for example, or through contact pads 16 on the bottom of the substrate. The incorporation of the testing process at such a point in the fabrication process may be particularly advantageous in embodiments in which separate covers are formed over each device as discussed further in the description of FIG. 5 below. In this manner, placing covers on devices, which fail testing procedures, may be avoided. In other embodiments, the devices may be tested subsequent to the singulation process as described below in reference to FIG. 6.

Figure 4A:
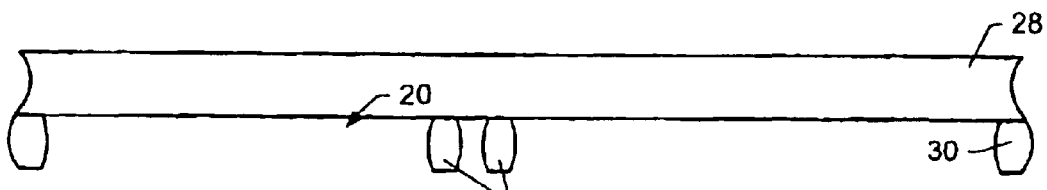
FIG. 4A is a partial cross-sectional view of an embodiment of a cover which may be affixed to the substrate of FIG. 3.
Figure 4B:
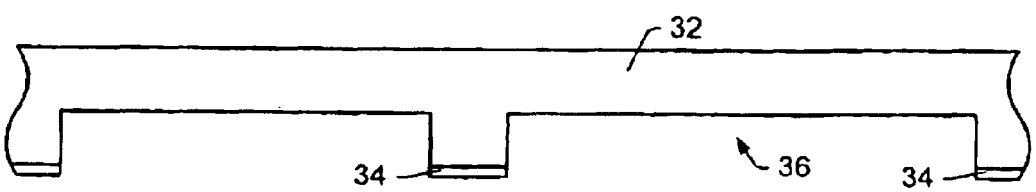
FIG. 4B is a partial cross-sectional view of an alternative embodiment of a cover.

Regardless of whether the devices are tested before or after the singulation of substrate 10, the released MEMS devices are preferably protected before the singulation process is performed. FIGS. 4A and 4B illustrate partial cross-sectional views of exemplary embodiments of covers which may be affixed over MEMS devices 20 of FIG. 3. Such covers may protect MEMS devices 20 from handling processes or the introduction of contaminants. The cover of FIG. 4A includes cover plate 28 and sealing layer 30. In some embodiments, sealing layer 30 may be attached to the lower surface of cover plate 28. In yet other embodiments, some or all of sealing layer 30 may be deposited on substrate 10 as discussed further in the description of FIG. 7 below. In some embodiments, sealing layer 30 may be arranged in a pattern. For example, in some embodiments, sealing layer 30 may include an array of laterally arranged structures, such as but not limited to, rings or grids. In addition or alternatively, sealing layer 30 may include one or more layers. In general, sealing layer 30 may be adapted to seal devices around which the layer is arranged such that a protective enclosure around devices is formed. Preferably, sealing layer 30 is thick enough such that the protective enclosure will give the devices enough room to operate. In some embodiments, for example, sealing layer 30 may have a thickness on the order of a few microns to the order of a few hundreds of microns. Larger or smaller thicknesses of sealing layer 30, however, may be appropriate depending on the design specifications of the circuit.

In some cases, substrate 10, sealing layer 30, and cover plate 28 may together form a protective enclosure around the device. In some embodiments, the protective enclosure may be about a single device. In other embodiments, the protective enclosure may be about multiple devices. In particular, sealing layer 30 may be arranged about one or multiple devices. In addition or alternatively, cover plate 28 may be arranged over one or multiple devices. In the embodiment illustrated in FIG. 4A, cover plate 28 may be adapted to be arranged over MEMS devices 20 illustrated in FIG. 3 and sealing layer 30 may be adapted to be arranged around each of MEMS devices 20.

In some embodiments, cover plate 28 may include a ceramic material, such as alumina. The use of such a material may be particularly advantageous when substrate 10 includes a ceramic material. However, other materials such as, glass, silicon, kovar, quartz, metal, semi-insulating semiconductors, polymer, and other ceramics, may be used for cover plate 28. In addition, cover plate 28 may or may not include the same material as substrate 10. Depending on the sealing method used, sealing layer 30 may include solder, metal, ceramic, glass, or a polymeric adhesive such as a thermoplastic, elastomeric or epoxy. For example, sealing layer 30 may include a metal when the devices are sealed by soldering or thermocompression bonding or other metal to metal bonding technique. In other cases, sealing layer 30 may include ceramic or glass when frit sealing or fusing is used to seal the devices. In yet other embodiments, sealing layer 30 may include partially cured epoxy printed onto ceramic, or a thermoplastic bonding material that has been applied to the ceramic prior to placement or is placed as a separate layer before bonding. In an embodiment in which a transparent material is used for substrate 10, sealing layer 30 may include UV curable adhesive such that curing process of the sealing layer as described below may be eliminated. This approach may be especially well suited for packaging optical MEMS devices.

An alternative embodiment of a cover used for protecting MEMS devices 20 of FIG. 3 is illustrated in FIG. 4B. Such a cover may include cover plate 32 with recesses 36. Preferably recesses 36 are arranged within the lower surface of cover plate 32 such that recesses 36 may be aligned over devices when cover plate 32 is coupled to a substrate. Recesses 36 may be formed within cover plate 32 in a variety of manners and may depend on the material of cover plate 32. For example, etching of recesses 36 may be used when cover plate 32 includes a semiconductor material. Other recess formation methods may include molding of polymer cover plates, embossing or photo-chemical machining of metal cover plates, stacking of unfired ceramic sheets and firing to form a three dimensional structure and ultrasonic machining of glass cover plates. Regardless of the material of cover plate 32, recesses 36 are preferably deep enough such that underlying devices have enough room to operate upon coupling the cover to the substrate. In this manner, recesses 36 may be laterally arranged about one or more devices upon coupling the cover plate 32 to substrate 10 in some embodiments. As such, cover plate 32 and substrate 10 may alone, in some embodiments, be used to form an enclosure about one or more devices. Exemplary techniques for affixing a cover directly to a substrate may include anodic bonding between a semiconductor and a glass, or direct bonding of two semiconductors. (For these particular methods, one or both of the substrate and cover would be formed from a semiconductor.) Consequently, a cover such as that of FIG. 4B may not include a sealing layer in some embodiments.

Alternatively, the cover may include sealing layer 34 arranged upon unrecessed portions of cover plate 32 as shown in FIG. 4B. In yet other embodiments, some or all of sealing layer 34 may be deposited on substrate 10 as discussed further in detail below. The need for sealing layer 34 may depend on the materials of cover plate 12 and substrate 10 and the method used for affixing the cover plate to the substrate. The use of sealing layer 34 may allow a relatively low-temperature process to be used, as compared to, for example, a semiconductor-to-semiconductor bonding. The sealing layer may significantly broaden the range of materials which can be used for the substrate and cover, by allowing many such materials to be joined using processes gentle enough to prevent device damage. Such damage may be generated through, for example, outgassing and/or thermal distortion.

The inclusion of recesses 36 may allow a thinner sealing layer to be used as compared to the cover embodiment shown in FIG. 4A. In particular, sealing layer 34 may include a thickness between approximately one micron and hundreds of microns. Larger or smaller thicknesses of sealing layer 34, however, may be appropriate depending on the design specifications of the circuit and the materials used. In general, sealing layer 34 may include similar materials as those used for sealing layer 30 as described in FIG. 4A. As such, sealing layer 34 may include solder, metal, ceramic, glass or adhesive such as thermoplastic, elastomeric or epoxy. Furthermore, sealing layer 34 may be arranged in a pattern, such as rings or grids. In addition or alternatively, sealing layer 34 may include one or more layers. Moreover, sealing layer 34 may be adapted to seal devices around which the layer is arranged such that a protective enclosure around devices is formed.

The cover plate, whether planar or recessed, may also be processed to include a getter material. Such a material will preferentially remove from the MEMS cavity moisture, hydrogen, carbon monoxide or dioxide or other contaminant gas or particulate matter that may impact the function of the MEMS device. Such materials could be applied either in sheet form to the inside of a cover or could be sputtered on to the cover if so desired and if the correct materials are chosen. They also could be deposited on other areas in the package such as the package substrate.

Figure 5A:
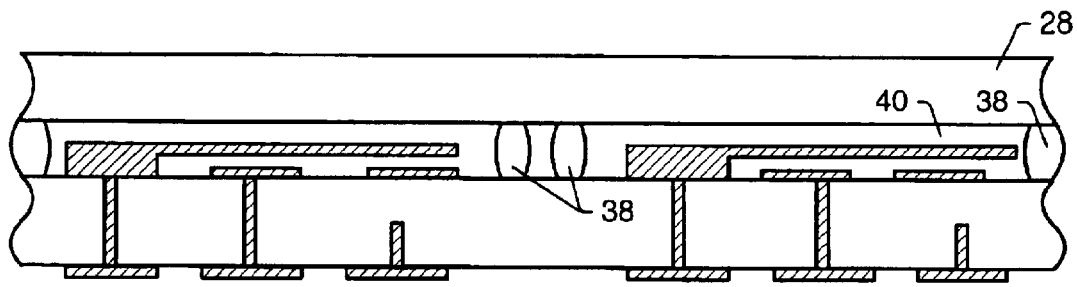
FIG. 5A shows the MEMS devices of FIG. 3 covered by the cover of FIG. 4A.

FIG. 5A illustrates the cover of FIG. 4A affixed to the substrate 10 of FIG. 3. In other embodiments, a different cover such as the cover of FIG. 4B could be used. In FIG. 5A, cover plate 28 is arranged over MEMS devices 20. Preferably, cover plate 28 is spaced sufficiently above MEMS devices 20 to permit proper electromechanical operation of the device. In addition, sealing layer 30 is affixed to substrate 10 to form sealing structure 38 interposed between substrate 10 and cover plate 28 and laterally surrounding MEMS device 20. Consequently, sealed cavity/enclosure 40 may be formed spaced above MEMS device 20 and substrate 10. In some embodiments, sealing structures 38 may laterally surround a single device. In other embodiment sealing structures 38 may laterally surround a plurality of devices. In this manner, one or more sealing structures may be contained within the topography of FIG. 5A.

Figure 5B:
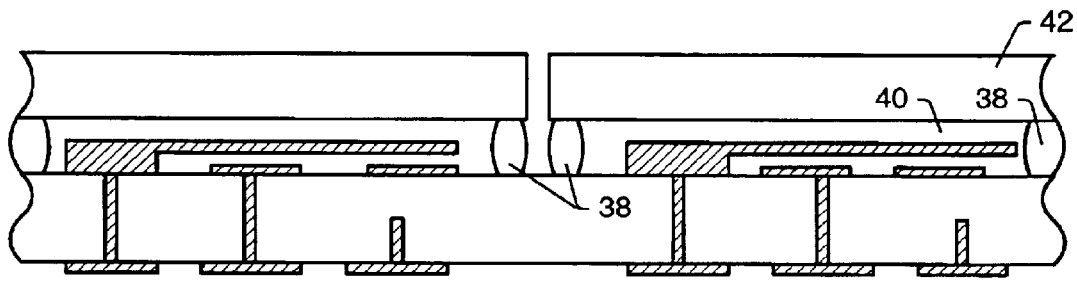
FIG. 5B shows an alternative embodiment in which each of the MEMS devices is covered with a separate cover.

In alternative embodiments, a topography may include a plurality of cover plates such as illustrated in FIG. 5B. Such an embodiment may include separate covers 42 affixed to substrate 10. As with cover plate 28, covers 42 are preferably spaced sufficiently above MEMS devices 20 to permit proper electromechanical operation of the device. In some embodiments, separate covers 42 may each cover a single device, while in other embodiments, separate covers 42 may each cover multiple devices. The placement of covers 42 may be conducted using pick-and-place technology, for example. Such a technology may be useful for selectively placing separate covers 42 over devices and not placing covers over other devices. In particular, such a selective scheme may be advantageous when devices have failed quality tests subsequent to releasing the devices. Consequently, processing time and costs may be saved by not placing separate covers 42 over such devices. In addition or alternatively, testing processes may be conducted subsequent to forming cavity/enclosure 40 around one or more devices. Such a test process may be conducted through the connection pads formed upon the bottom of substrate 10, for example. Moreover, the array of devices protected and packaged in FIGS. 5A and 5B may be transported and/or provided to customers prior to singulation of substrate 10.

Affixing one or more covers to a substrate may be conducted in a variety of manners. For example, the cover may be affixed to substrate 10 by solder reflow, transient liquid phase bonding, welding, brazing, frit sealing, curing, or using polymeric adhesives. As noted above, such processes may be used to transform a sealing layer into sealing structure 38. Sealing structure 38 is preferably adapted to create cavity/enclosure 40 around one or more devices. In some cases, affixing the cover to substrate 10 may include a thermal process. For example, affixing the cover to substrate 10 by solder reflow may include heating a solder seal, such as gold-tin, with a sealing layer to form sealing structure 38. In such an embodiment, the sealing layer preferably includes a metal. In another embodiment, affixing the cover to substrate 10 may include forming a liquid phase between adjacent metal layers, such that an alloy may be produced and isothermally solidify. The resulting bond structure may advantageously have a higher melting point than the original materials. Indium/gold material set and/or tin or lead alloys may be particularly useful in such an embodiment. In other embodiments, frit or adhesive sealing may be used to create sealing structure 38. In such an embodiment, sealing structures may be located on top of interconnects 18 in some cases. In an embodiment in which an optically clear material is used for substrate 10, a UV curable adhesive may be used for the sealing layer such that a thermal process may not be needed.

Figure 6:
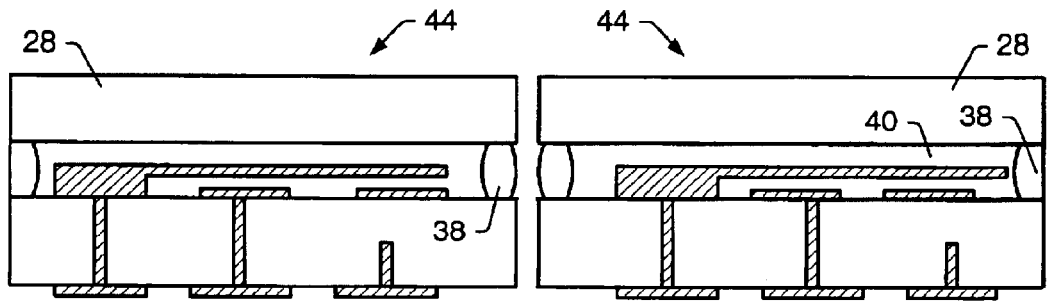
FIG. 6 shows the packaged MEMS devices of FIG. 5A after singulation of the devices.

FIG. 6 illustrates substrate 10 of FIG. 5A singulated to produce packaged, protected MEMS circuits 44. The singulation of substrate 10 of FIG. 5B (not shown) would look similar to that of FIG. 5A. In either embodiment, MEMS circuits 44 may be suitable for circuit board installation. The singulation process is preferably conducted such that substrate 10 is diced along sealing structures 38. In this manner, sealed cavity/enclosures 40 may remain intact after the singulation process such that MEMS devices 20 may be protected along the lateral sides of the circuits. Singulating into individual sealed packages may be done using tools suitable for dicing wafers and/or cutting packaging materials. In particular, tools suitable for cutting through materials of cover plate 28, sealing structures 38, and substrate 10 may be used. For example, the singulation process may include using a wafer saw or laser cutting, for example. In some embodiments, it may be desirable to have cover plate 28 grounded. Grounding cover plate 28 may prevent charging and electromagnetic interference of the devices, and may also improve high-frequency performance. In such an embodiment, cover 28 and sealing structure 38 may include a conductive material such as conductive cement or alloyed metals. Grounding may be achieved by coupling sealing structure 38, and thereby cover plate 28, to conductive features 16 on the bottom surface of substrate 10. This can be done by arranging for sealing structure 38 to contact one or more of interconnects 18, possibly using interconnect formed on the upper surface of substrate 10. The appropriate conductive features 16 can be connected to the circuit board ground, thereby grounding the sealing structure and cover.

Figure 7:
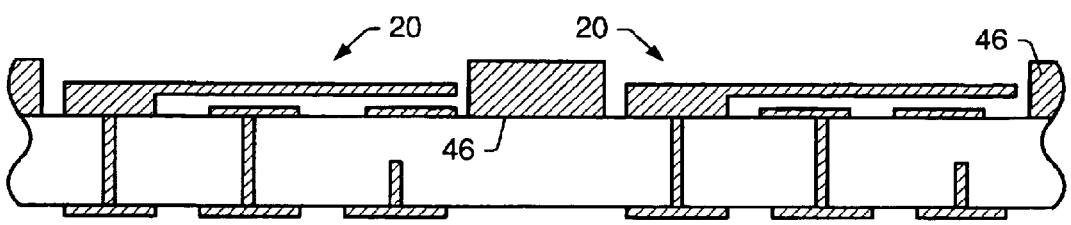
FIG. 7 is a partial cross-sectional view of an alternative embodiment in which a sealing structure is formed on the packaging substrate before a cover is affixed.

FIG. 7 illustrates an alternative embodiment of a topography including MEMS devices 20 arranged over substrate 10. In particular, FIG. 7 illustrates sealing layer 46 formed on substrate 10 and laterally surrounding MEMS devices 20. In general, the topography of FIG. 7 may be formed using the processes described in FIGS. 1–3 with the additional formation of sealing layer 46. In addition, sealing layer 46 may include similar materials as those described for sealing layers 30 and 34 above. As such sealing layer 46 may include the above-described adhesives, solder, metal, epoxy, ceramic, or glass. In some embodiments, sealing layer 46 may include the same type of material as elements 24 and 25 and/or cantilever element 26. In such an embodiment, sealing layer 46 may be formed at same time as some or all of these elements. In an alternative embodiment, sealing layer 46 may include a different material than element 24 and cantilever element 26, and therefore may be formed separate from element 24 and cantilever element 26. Sealing layer 46 may be formed using similar lithography, deposition and etching techniques as those used to form elements 24, 25 and 26 and thus may be formed before, during or after the formation of some or all of these elements, but prior to the releasing process described in FIG. 3.

In some embodiments, sealing layer 46 may be combined with a corresponding sealing layer of a cover, such as those illustrated in FIGS. 4A and 4B, to affix the cover to substrate 10 and form a sealing structure interposed between the substrate 10 and the cover, such as sealing structure 38. For example, in one embodiment, sealing layer 46 may include gold and the sealing layer on the cover may include indium. In such an embodiment, affixing the cover to substrate 10 may include heating the layers to form gold/indium alloy. A similar sort of alloying may be done with other metals systems, such as tin/lead, for example. The choice of metallic materials is made such that one metal or alloy will melt at a low temperature and dissolve in the other metal, forming a higher melting point alloy. The bond solidifies isothermally resulting in a seal which can tolerate higher temperatures than the original metals used in the seal. In other embodiments, sealing layer 46 may represent the entire sealing layer with which to bond with a cover plate to form a sealed enclosure about MEMS devices 20 and more specifically spaced above MEMS devices 20 and substrate 10. In such an embodiment, sealing layer 46 may include any metal with which to alloy with a metal cover plate. Another metal to metal sealing configuration that may be used is gold to gold thermocompression bonding. Other soldering or brazing materials may also be used to form the seal. However, the joining should be performed in such a way as to eliminate exposure of the MEMS structures to fluxes normally used in soldering or brazing.

Figure 8A:
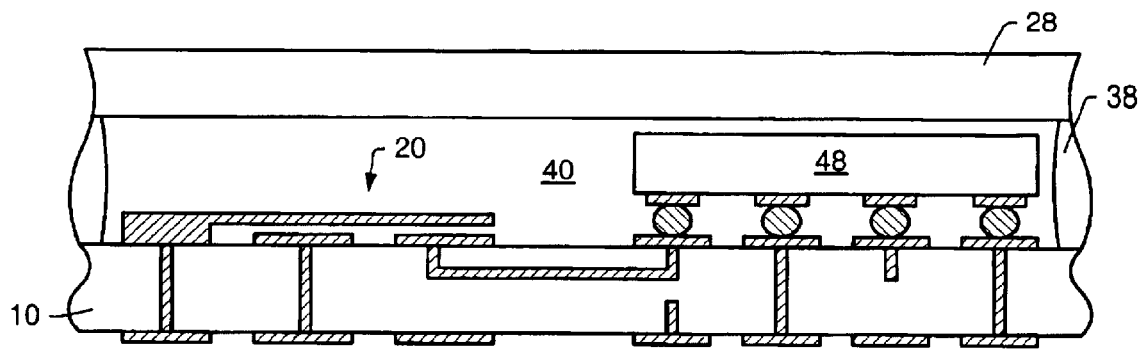
FIG. 8A is a partial cross-sectional view of a packaged MEMS device in which an integrated circuit is also included within the package.

An alternative package configuration fabricated from the method described herein is illustrated in FIG. 8A. In particular, a topography is illustrated which includes integrated circuit 48 spaced apart from MEMS device 20 and included within cavity/enclosure 40. Such an enclosure is bounded by substrate 10, sealing structure 38, and cover plate 28. However, in other embodiments, the enclosure may be bounded only by substrate 10 and cover plate 28. As noted above, the drawings, including FIGS. 8A and 8B, are not to scale. For example, the thickness of integrated circuit 48 may in some embodiments be between about 300 and 600 microns, while that of MEMS device 20 may be on the order of a few microns. The configuration of FIG. 8A may therefore involve modifications such as a particularly thick sealing structure 38, or possibly a thinning of the substrate of IC 48.

Integrated circuit 48 may be fabricated before or after the formation of MEMS device 20. In particular, integrated circuit 48 may be fabricated on package substrate 10 before, during or after MEMS fabrication or attached to the packaging substrate via flip-chip or wirebond technology before or after the release of MEMS device 20. In an embodiment for which substrate 10 is a semiconductor substrate, and IC 48 is fabricated directly into substrate 10, the fabrication sequence of integrated circuit 48 and MEMS device 20 may depend on the likelihood of introducing contaminants onto the topography during the integrated fabrication process. In an embodiment for which substrate 10 is not a semiconductor, integrated circuit 48 may be separately bonded to substrate 10. Flip-chip bonding with solder bumps to pads on the surface of substrate 10 is shown in FIG. 8A. An IC could also be attached face-up with wire-bonding connections made to pads on the substrate and/or to MEMS device 20. In some embodiments, integrated circuit 48 may be electrically coupled to EMS device 20 using an interconnect within substrate 10. In other embodiments, integrated circuit 48 may be electrically coupled to other devices, such as other MEMS devices or integrated circuits arranged on substrate 10. Preferably, integrated circuit 48 is electrically coupled to devices which are arranged within same die portion of substrate 10. In this manner, the coupled devices may be adapted to be operable through application of electrical signals through conductive features within and on substrate 10 before and after the singulation process described in reference to FIG. 6 above.

Figure 8B:
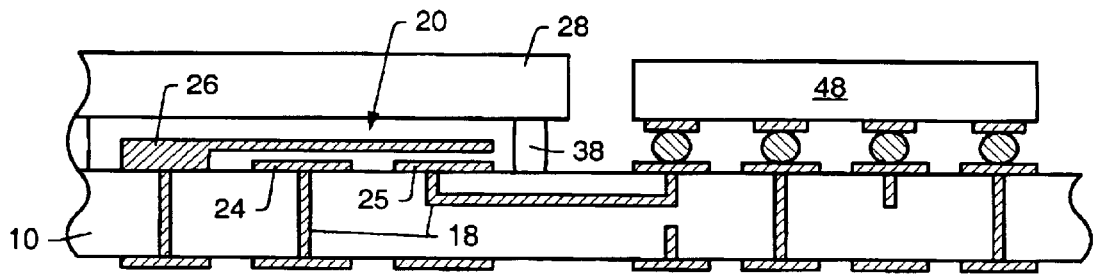
FIG. 8B is a partial cross-sectional view of an alternative embodiment in which an integrated circuit is mounted outside of the protective enclosure around a MEMS device.

An alternative embodiment of a circuit including a packaged MEMS device and an integrated circuit is shown in FIG. 8B. In the embodiment of FIG. 8B, cover 28 extends only over MEMS device 20, while IC 48 is left uncovered. This configuration could be achieved using a single cover 28 for the entire substrate in which openings are formed in portions which will overlie integrated circuit positions on substrate 10 once the cover is affixed. Alternatively, an individual cover could be affixed over each MEMS device. Either type of cover may be affixed using techniques discussed above in the descriptions of FIGS. 5 and 7. Covering only the MEMS devices may advantageously allow them to be protected while the integrated circuits are attached. A protective dielectric coating may subsequently be applied over the mounted integrated circuit to protect it, as is often done in IC technology. Although the IC is shown flip-chip mounted in FIGS. 8A and 8B, it could alternatively be mounted face-up, as noted above. The IC may be electrically coupled to the MEMS device through interconnects 18, possibly in conjunction with interconnects formed on the upper surface of substrate 10.

Figure 9:
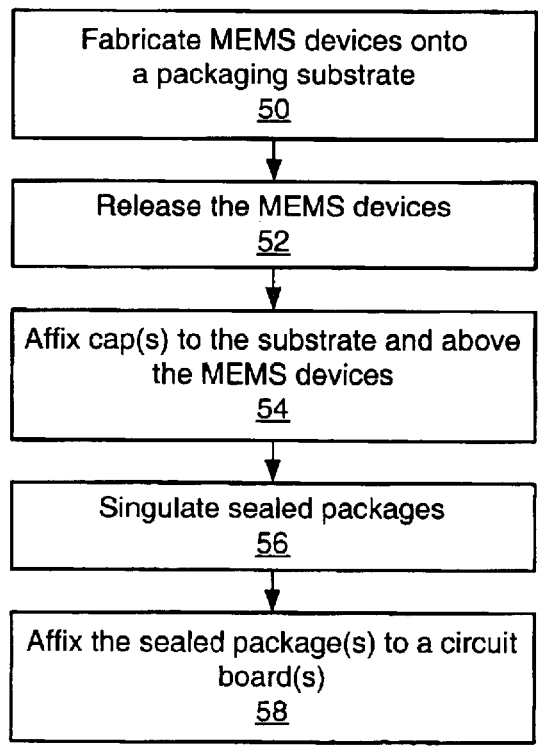
FIG. 9 is a flow diagram illustrating an embodiment of a method for fabricating and packaging MEMS devices as described herein.

A flowchart of the method described herein is illustrated in FIG. 9. As described in reference to FIGS. 1–8B, such a method may include fabricating MEMS devices onto a packaging substrate as shown in step 50. The method may further include releasing the MEMS devices in step 52 and affixing one or more covers over the MEMS devices in step 54. In step 56, the sealed devices are singulated. Subsequently, the method may include step 58, which may include affixing the singulated sealed devices to circuit boards. The fabrication of MEMS devices directly on a packaging substrate may advantageously reduce the packaged size of the circuit. In addition, eliminating the need to wire-bond a separate MEMS chip to a packaging substrate may allow better high-frequency performance of the device. Moreover, the method described herein allows a device to be packaged as an integral part of the fabrication process of the devices at the "wafer-level", thereby reducing handling of the devices and fabrication costs.

Organic materials, especially thermoset adhesives (or "epoxies"), are widely used in cover (or "lid," "cap") sealing of electronic devices. Organic materials provide a near-hermetic seal at temperatures less than solder or glass frit seal temperatures and a lower cost method of sealing a cover to a packaging substrate. A thermoset is a normally rigid material and a network polymer having substantially restricted chain motion due to a high degree of crosslinking. Thermoset adhesives may be applied to a cover by screen printing or transfer printing. As an intermediate step, the thermoset adhesive can be thermally processed to partially cure or "B-stage" the adhesive. B-stage is a term that generally refers to an intermediate stage of a reaction in which the material will soften when heated and will swell in the presence of certain liquids, but is not completely fused or cured. The cover is then affixed to the body of the package and heat and pressure are applied to completely cure the thermoset adhesive. While this procedure reduces the amount of organic material given off during curing of the thermoset adhesive, the procedure does not eliminate the organic material produced during curing.

A second use for organic materials in electronic device packaging is attaching a semiconductor-based IC to a packaging substrate. Thermoset adhesives are commonly used for this application. For example, a thermoset adhesive may be dispensed as a paste on a surface of a packaging substrate. The IC die is placed onto the paste, and the thermoset adhesive is cured to attach the IC die to the substrate. A thermoplastic, or a "plastic," is a linear or branched polymer that can be melted upon the application of heat. Thermoplastic adhesives are used to attach IC die to a packaging substrate and to attach a ceramic or organic substrate that has silicon die formed thereon to a packaging substrate or a support. Examples of using organic materials to package semiconductor-based IC are illustrated in U.S. Pat. Nos. 5,061,549 to Shores and 5,401,536 to Shores, which are incorporated by reference as if fully set forth herein.

The amount and type of organic material given off by organic adhesives during sealing or die attach is generally not a concern for semiconductor-based integrated circuit devices. However, organic material produced during sealing or die attach is detrimental to the function of MEMS devices, and in particular weight sensitive or surface-cleanliness sensitive MEMS devices, thereby preventing using low cost, low temperature organic materials for MEMS die attach or package sealing of MEMS devices.

In one preferred embodiment, a low-cost method for sealing MEMS devices uses a thermoplastic as a sealing material. Using a thermoplastic eliminates contamination of the MEMS device by products that may be produced by curing a thermoset adhesive and provides a barrier to conditions external to the MEMS package such as handling and environmental contaminants. In an additional preferred embodiment, a MEMS die or device is attached to a packaging substrate using a thermoplastic as a die attach adhesive, which also eliminates contamination of the MEMS device by-products outgassed during curing of a thermoset adhesive. These embodiments are based on the discovery that a thermoplastic, if processed as described herein, is compatible with reliable MEMS operation.

FIG. 5A illustrates an embodiment of a microelectromechanical circuit that includes cover plate 28 attached to packaging substrate 10. In one embodiment, sealing structure 38 is a thermoplastic, and MEMS devices 20 are disposed between the cover plate and the packaging substrate. Alternatively, the cover plate illustrated in FIG. 4B can be attached to packaging substrate 10 using the thermoplastic. Sealing structure 38 may also include more than one thermoplastic. The thermoplastic may include one or more polymeric resins and, optionally, one or more fillers. Examples of appropriate polymeric resins include, but are not limited to, polysulfone, and other sulfone polymers, polyimide, polyetherimide, polyamides or nylons, polycarbonates, cellulose esters, polyester, phenoxy resin, polyarylates, polyvinylidene fluoride, polyacrylate, acrylic polymers, acrylic copolymers, and polyurethanes. The fillers may be selected to alter thermal or electrical properties of the thermoplastic. For example, a thermoplastic including a filler may be electrically conductive, and a thermoplastic that does not include a filler may not be electrically conductive. Examples of appropriate fillers include, but are not limited to, silver ("Ag"), gold ("Au"), silver-plated copper particles, aluminum oxide ("$Al_2O_3$"), beryllia ("BeO"), silica ("$SiO_2$"), silicon carbide ("SiC"), barium titanate ("$BaTiO_3$"), steatite, boron nitride ("BN"), and aluminum nitride ("AlN"). Examples of commercially available thermoplastic include, but are not limited to, STAYSTIK® Thermoplastic Adhesives from Cookson Electronics—Semiconductor Products, Alpharetta, Ga. and thermoplastics available from AI Technology, Inc., Princeton Junction, N.J.

Figure 10:
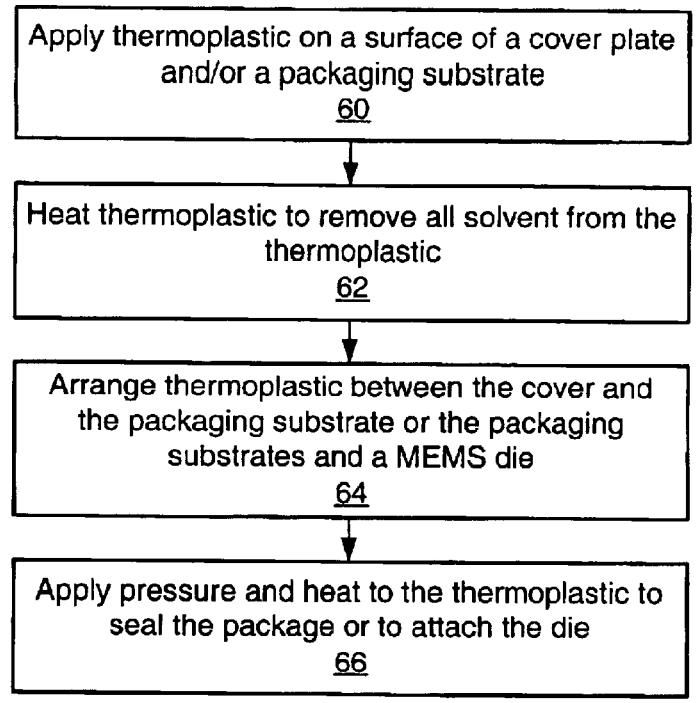
FIG. 10 is a flow diagram illustrating an embodiment of a method for packaging of a MEMS device using a thermoplastic as described herein.
Figure 11:
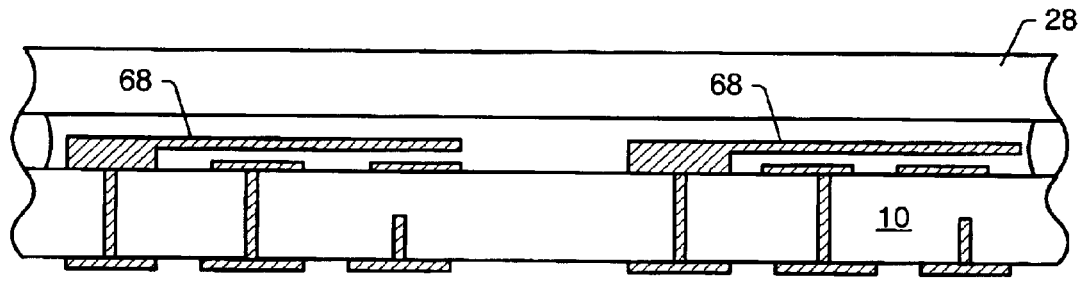
FIG. 11 is a partial cross-sectional view of an alternative embodiment in which two MEMS devices are arranged within one protective enclosure.
Figure 12:
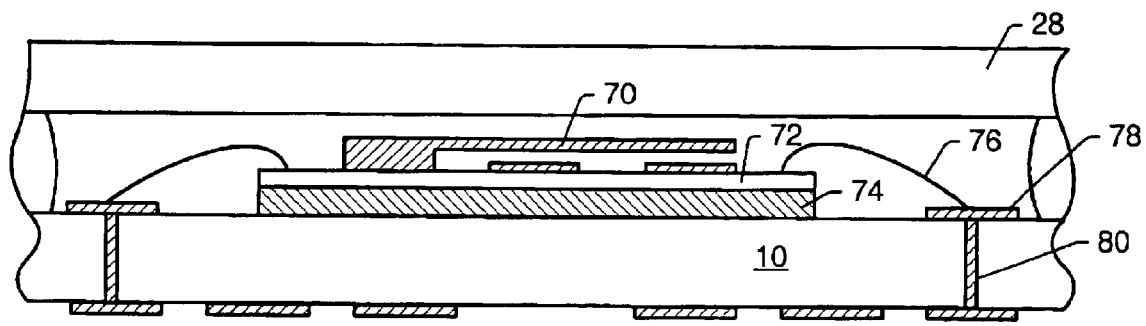
FIG. 12 is a partial cross-sectional view of an alternative embodiment in which a MEMS device is formed on a substrate that is attached to a packaging substrate.

FIG. 10 is a flow chart illustrating an embodiment of a method described herein. The method may include arranging a thermoplastic on a surface of a cover plate and/or a packaging substrate, as shown in step 60. The thermoplastic may be applied to the cover plate or the packaging substrate prior to heating. For example, as shown in FIG. 4A, sealing layer 38 may be applied to cover plate 28 by applying a thermoplastic to one side of the cover plate in a predetermined pattern. Alternatively, as shown in FIG. 4B, sealing layer 34 may be applied to cover plate 32 by applying a thermoplastic to unrecessed portions of the cover plate. Although the cover plates illustrated in FIGS. 4A and 4B show cover plates in an array form (i.e., a number of individual covers fabricated in an array on the same base piece of material), the covers may also be singulated, and the thermoplastic may be applied to individual covers. The cover plate or individual covers may be formed of any material to which the thermoplastic will adhere such as, but not limited to, glass, ceramic, silicon, a polymeric material, or electrically conductive metals or metal alloys. In addition, the cover plate or the individual covers and the sealing layer may be formed of the same thermoplastic or different thermoplastics. In another alternative, as shown in FIG. 7, sealing layer 46 may be applied to packaging substrate 10 and laterally surrounding MEMS devices 20. The thermoplastic may be applied to the cover plate or the packaging substrate using any technique known in the art such as screen printing, stencil printing, needle-dispensing, or transfer printing. Examples of techniques that may be used to apply the thermoplastic to the cover plate of the packaging substrate are illustrated in U.S. Pat. No. 6,136,128 to Chung, which is incorporated by reference as if fully set forth herein.

Thermoplastics are available in different forms. For example, the thermoplastic may be in a sheet form, a preform formed from a sheet of the thermoplastic, or a thermoplastic in a paste form. For example, a thermoplastic may be available in an initial form as a paste. The paste may include dissolved thermoplastic, one or more fillers, and a solvent. A thermoplastic may also be available as a sheet or as a film. The sheet can be cut (i.e., die or laser cut) or shaped into a form factor based on the configuration of the MEMS package. A thermoplastic in sheet form also may or may not include one or more fillers. Each of the different forms of thermoplastics will have an initial amount of solvent present in the thermoplastic. The term "solvent" is used herein to refer to any volatile organic compound that may be present in a thermoplastic. Volatile organic compounds may include any chemical present in the thermoplastic except the polymeric resin and the fillers. The amount of solvent in the thermoplastic will vary depending on the initial form of the thermoplastic. For example, a thermoplastic paste will have a substantially larger amount of solvent than a sheet of thermoplastic. The amount of solvent present in each initial form of thermoplastic, however, is greater than an amount of solvent that if outgassed from the thermoplastic during sealing of a MEMS package would cause damage to, or otherwise hinder the operation of, the MEMS device. Examples of solvents that may be initially present in a thermoplastic include, but are not limited to, DPMA glycol ether acetate, ethyl 3-ethoxypropianate, dibasic esters, petroleum ether, and N-methylpyrrolidone.

In a preferred embodiment, the thermoplastic is heated to a temperature sufficient to remove all solvent from the thermoplastic, as shown in step 62 of FIG. 10. Heating the thermoplastic also adheres the thermoplastic to the cover plate or the packaging substrate depending upon where the thermoplastic has been applied. The temperature may be above a boiling point of a solvent in the thermoplastic. For example, in the case of a relatively low melting thermoplastic, the thermoplastic may be heated at atmospheric pressure (i.e., without applied pressure), in a vacuum, or with applied pressure at a temperature of about 215° C. to about 220° C. for about 2 hours. The temperature may vary, however, depending on the boiling point of the solvent in the thermoplastic and possibly on the polymeric resin of the thermoplastic. For example, the temperature used in the above heating step should be lower than a temperature of decomposition for the polymeric resin. The temperature may also be substantially higher than a boiling point of the solvent to ensure complete removal of the solvent from the thermoplastic. In addition, if the thermoplastic includes more than one solvent, the temperature may also depend on the boiling points of each solvent in the thermoplastic. The length of the heating step and the pressure may also be varied and may be determined based on characteristics of the thermoplastic used to determine the temperature. Therefore, variations in the temperature and length of the above heating step will be obvious to one of ordinary skill in the art of MEMS fabrication and/or packaging having the benefit of this disclosure.

Such heating will reduce the amount of solvent in the thermoplastic to a level below that which could contaminate MEMS devices. An amount of solvent in a thermoplastic that could contaminate a MEMS device may be one or more volatile molecules depending on the MEMS device. Therefore, a thermoplastic after this heating step is substantially free of solvents and will have less than one or more volatile molecules of the solvent remaining in the thermoplastic. This heating step may be performed using any heating arrangement that allows substantially complete evaporation of the solvent. In addition, the heating step may be modified to increase the efficiency of solvent removal or to reduce the amount of time that the thermoplastic is heated. For example, the heating step may be performed under vacuum, under pressure, or with substantial ventilation to increase the rate of solvent removal. In addition, the sealing layer may also be applied to the packaging substrate before the MEMS devices are formed upon or are attached to the packaging substrate. Therefore, regardless of whether the thermoplastic is applied to the cover plate or the packaging substrate, the MEMS device may not be heated during the solvent removal step.

Heating the thermoplastic to a temperature above a boiling point of a solvent in the thermoplastic is different than other methods for sealing an electronics package using a thermoplastic or another organic material. For example, other organic materials are often B-staged to partially cure the organic material prior to sealing a package. B-staging is typically used to improve handling of the material during a packaging process. B-staging the material, however, will leave a substantial amount of solvent in the organic material because the material is only partially cured at this point. In addition, if a thermoset adhesive is heated such that all solvent is driven out of the adhesive prior to sealing the package, the thermoset adhesive would cure completely, and sealing a package with the completely cured thermoset adhesive would be impossible.

Additionally, thermoplastics are different that thermosets in the sense that thermosets undergo a curing reaction while thermoplastics are not cured, but are melted. This difference is, in fact, one reason why thermoplastics provide advantageous over thermoset. For example, using a thermoplastic instead of a thermoset eliminates outgassing of reaction byproducts that are produced during curing of the thermoset adhesive. In addition, the thermoplastic may be melted to seal a package, and the package maybe unsealed by re-melting the thermoplastic and using force to unseal the package. Therefore, packages sealed with thermoplastic may be reworked while packages sealed with thermosets may be damaged if reworking the package is attempted. In this manner, thermoplastics provide several advantages over thermoset while retaining the cost advantages of using an organic material for MEMS packaging.

Furthermore, other methods for sealing a package with a thermoplastic material usually do not include a heating step as described above because the packages are designed for electronic devices such as semiconductor-based ICs. Therefore, thermoplastics used for packaging of ICs are not solvent-free. Such ICs, however, are not as susceptible to contamination from solvents as MEMS devices are. For example, a MEMS device may be damaged by an amount of organic material on the order of a few molecules. Such a small amount of material may be problematic for MEMS devices, and may be particularly problematic for MEMS devices that are sensitive to weight alterations and surface cleanliness. Therefore, eliminating the possibility of contamination during die attach or package sealing presents a significant problem for identifying a relatively low cost packaging for MEMS devices. Such an amount of organic material, however, would be considered negligible for an IC because such a small amount of material would not cause damage to, or otherwise hinder the operation of, the IC. Therefore, a heating step as described above is not used for packaging an IC with a thermoplastic. In addition, due to the relatively high temperature and the relatively long length of the heating step described above, heating a thermoplastic for an IC package in such an unnecessary manner would be highly undesirable and may, in some instances, damage the IC.

The solvent-free thermoplastic may be arranged between the cover plate and the packaging substrate, as shown in step 64 of FIG. 10. The thermoplastic is arranged to laterally surrounding a MEMS device disposed on the packaging substrate and to space the cover plate above the packaging substrate. The packaging substrate and the cover plate may be aligned and mated together in preparation for sealing using either appropriate tooling or visual alignment. The tooling may include any tooling known in the art such as pick-and-place technology as described above. The thermoplastic may be arranged between a packaging substrate having an array of MEMS devices disposed thereon and individual covers may be portions of a single cover plate for an array of MEMS devices, as shown in FIG. 5A. Alternatively, the thermoplastic may be arranged between a packaging substrate having an array of MEMS devices formed thereon and individual or singulated covers, as shown in FIG. 5B. In another embodiment, the thermoplastic may be arranged between a packaging substrate that has been singulated and singulated covers, as shown in FIG. 6.

The thermoplastic may be attached to the cover and the packaging substrate to form a protective enclosure around the device by applying pressure and heat to the thermoplastic substantially simultaneously, as shown in step 66 of FIG. 10. In one example, the thermoplastic may be heated to a temperature of about 160° C. in a ramp time of about 10 minutes and held at about 160° C. to about 165° C. for about 2 minutes. The temperatures should be above the melting, or reflow, temperature of the thermoplastic, but below a temperature at which the thermoplastic would be liquefied or decomposed. As such, the temperatures may vary depending upon the melting, or reflow, temperature of the thermoplastic being used to seal the package. For example, appropriate thermoplastics may have melting points ranging from about 100° C. to about 300° C., and the temperature for the heating step may vary from about 100° C. to about 400° C. The reflow temperature should also be lower than a temperature at which a MEMS device may be damaged. Therefore, a thermoplastic having a reflow temperature below a temperature at which a MEMS device may be damaged may be selected for packaging the MEMS device. In addition, the thermoplastic should have a reflow temperature above temperatures at which the MEMS device may be subsequently processed and/or used. In this manner, the thermoplastic may not reflow subsequent to attachment. Furthermore, the ramp time may vary from about 1 minute to about 20 minutes, and more particularly from about 7 minutes to about 15 minutes. The rate of heating will vary depending upon the temperature and the ramp time, but may be in a range of about 5° C./min to about 75° C./min. The time at which the thermoplastic is held at temperature may vary from about 10 seconds to about 5 minutes. Therefore, the time at temperature is relatively short in comparison to sealing processes for a thermoset, which may include heating the thermoset at temperature for about 1 hour to about 2 hours.

The pressure may be held at about 10 psi during heating. The pressure may vary, however, from about 5 psi to about 25 psi depending on the thermoplastic used for sealing the package. For example, the pressure should be low enough such that the thermoplastic will not flow a substantial distance laterally away from the original arrangement of the thermoplastic. Such flow of the thermoplastic may undesirably increase a width of the thermoplastic and decrease a height of the thermoplastic. The pressure may be applied to in a direction substantially perpendicular to an upper or lower surface of the cover/thermoplastic/packaging substrate stack of material. Heating for such a sealing operation may be carried out in an oven, a belt furnace, or any other apparatus known in the art with an appropriate configuration for alignment and application of pressure.

The thermoplastic may then be cooled. For example, the thermoplastic may be cooled to below about 100° C. in less than about 2 minutes. The time in which the thermoplastic is cooled may vary, however, from about 1 minute to about 20 minutes. The pressure applied during heating may be maintained on the thermoplastic during cooling. The sealed package may then be cooled under pressure back to approximately room temperature or about 25° C. Cooling may be performed using an apparatus that includes, for example, a chill plate maintained at an appropriate temperature and appropriate devices for flowing air over the package and maintaining pressure on the package. Alternatively, such cooling may be performed without pressure.

At this point, the cover is attached to the packing substrate thereby forming one or more sealed cavities around the MEMS devices. During attach, the thermoplastic undergoes a melting and re-solidification process rather than a cure process. Therefore, no chemical reaction byproducts are released from the thermoplastic, which can deposit on the MEMS devices. Removal of the solvent in a separate heating step described above, which is performed prior to the attaching step ensures that no residual solvent is evaporated from the adhesive, which can, in turn, condense and deposit on the MEMS device. Therefore, surfaces of the MEMS device are substantially free of solvents.

The packaging substrates, as shown in FIGS. 5A and 5B, may be separated into portions underlying the individual MEMS devices after the thermoplastic is attached to the covers and the packaging substrate. Separating the packaging substrate as shown in FIG. 5 also includes separating cover plate 28. Separating either of the packaging substrates may produce singulated MEMS packages, as shown in FIG. 6 and may be performed as described above. The protective enclosures formed by the covers, the thermoplastic, and the packaging substrate are adapted to remain intact after separation.

A thickness of the thermoplastic may be greater than or less than z-axis height requirements of the device. For example, if the cover does not have recesses, as shown in FIG. 4A, the thermoplastic may be thicker than z-axis height requirements of the device to space the cover plate above the packaging substrate and to provide a stand off for the MEMS devices. Alternatively, if the cover plate has recesses, as shown in FIG. 4B, a thickness of the thermoplastic may be less than z-axis height requirements of the device because the unrecessed portions of the cover plate provide a stand off for the MEMS devices. In this manner, the thickness of the thermoplastic may be selected to permit proper electromechanical operation of the MEMS device. Appropriate thicknesses for the thermoplastic may range from about 1 micron to hundreds of microns.

In an alternative embodiment, the cover plate or the individual covers and the sealing layer may be one continuous piece of thermoplastic. Such a continuous piece of thermoplastic may be attached to a substrate to form a protective enclosure around a MEMS device as described above. A cavity may be formed in the continuous piece of thermoplastic during heating to a temperature sufficient to remove substantially all solvent from the thermoplastic as shown in step 62 of FIG. 10. The cavity may be formed in the thermoplastic using any method known in the art for altering the shape of a polymer such as molding. Alternatively, the cavity may be formed prior to such a heating step. For example, a cavity may be formed in the thermoplastic during manufacturing. In such an embodiment, however, the thermoplastic may not be arranged on the packaging substrate prior to this heating step. After the material is substantially free of solvents, the

What is claimed is:

1. A microelectromechanical circuit, comprising:
   a cover attached to a packaging substrate by a thermoplastic;
   a microelectromechanical device disposed between the cover and the packaging substrate; and
   an additional microelectromechanical device disposed between the cover and the packaging substrate, wherein the cover, the packaging substrate, and the thermoplastic form one protective enclosure around the device and the additional device.

2. The circuit of claim 1, wherein the thermoplastic is substantially free of solvents.

3. The circuit of claim 1, wherein surfaces of the device are substantially free of solvents.

4. The circuit of claim 1, wherein a thickness of the thermoplastic is greater than z-axis height requirements of the device.

5. The circuit of claim 1, wherein a thickness of the thermoplastic is less than Z-axis height requirements of the device.

6. The circuit of claim 1, wherein the thermoplastic laterally surrounds the device.

7. The circuit of claim 1, further comprising a semiconductor-based integrated circuit disposed between the cover and the packaging substrate, wherein the cover, the packaging substrate, and the thermoplastic form one protective enclosure around the device, the additional device, and the integrated circuit.

8. The circuit of claim 1, wherein the device is formed on a substrate, wherein the substrate is attached to the packaging substrate with an additional thermoplastic, and wherein the additional thermoplastic is substantially free of solvents.

9. The circuit of claim 1, wherein the device is formed on the packaging substrate.

10. An array of microelectromechanical circuits, comprising:
- a packaging substrate;
- first and second microelectromechanical devices disposed upon an upper surface of the packaging substrate;
- first and second covers spaced above the packaging substrate and the first and second devices, respectively; and
- a thermoplastic interposed between the packaging substrate and the first and second covers, wherein the thermoplastic laterally surrounds each of the first and second devices, wherein the packaging substrate, thermoplastic and first and second covers combine to form a protective enclosure for each of the first and second devices, and wherein the protective enclosures are adapted to remain intact after separation of the packaging substrate portion underlying the first device from that underlying the second device.

11. The array of claim 10, wherein the first and second covers are portions of a single cover for the array, and wherein a thickness of the thermoplastic is greater than z-axis height requirements of the first and second devices.

12. The array of claim 10, wherein the first and second covers comprise first and second recessed portions aligned over the first and second devices, respectively, and wherein a thickness of the thermoplastic is less than z-axis high requirements of the first and second devices.

13. A microelectromechanical circuit, comprising a cover attached to a packaging substrate by a thermoplastic and a microelectromechanical device disposed between the cover and the packaging substrate, wherein the device is formed on a substrate, wherein the substrate is attached to the packaging substrate with an additional thermoplastic, and wherein the additional thermoplastic is substantially free of solvents.

14. The circuit of claim 13, wherein surfaces of the device are substantially free of solvents.

* * * * *

UNITED STATES PATENT AND TRADEMARK OFFICE
CERTIFICATE OF CORRECTION

PATENT NO.    : 6,809,412 B1
DATED         : October 26, 2004
INVENTOR(S)   : Tourino et al.

It is certified that error appears in the above-identified patent and that said Letters Patent is hereby corrected as shown below:

<u>Title page,</u>
Item [73], Assignee, please delete "Teravictu Technologies" and substitute therefor
-- Teravicta Technologies --.

Signed and Sealed this

Tenth Day of May, 2005

JON W. DUDAS
*Director of the United States Patent and Trademark Office*